(12) United States Patent
Fukazawa et al.

(10) Patent No.: US 7,718,553 B2
(45) Date of Patent: May 18, 2010

(54) METHOD FOR FORMING INSULATION FILM HAVING HIGH DENSITY

(75) Inventors: Atsuki Fukazawa, Tama (JP); Nobuo Matsuki, Tama (JP)

(73) Assignee: ASM Japan K.K., Tokyo (JP)

( * ) Notice: Subject to any disclaimer, the term of this patent is extended or adjusted under 35 U.S.C. 154(b) by 691 days.

(21) Appl. No.: 11/525,147

(22) Filed: Sep. 21, 2006

(65) Prior Publication Data

US 2008/0076266 A1    Mar. 27, 2008

(51) Int. Cl.
  *H01L 21/469* (2006.01)
(52) U.S. Cl. .................. 438/786; 438/769; 438/792
(58) Field of Classification Search .................. None
  See application file for complete search history.

(56) References Cited

U.S. PATENT DOCUMENTS

| | | | |
|---|---|---|---|
| 5,393,815 | A | 2/1995 | Takeda et al. |
| 5,487,920 | A | 1/1996 | Lopata et al. |
| 5,922,411 | A | 7/1999 | Shimizu et al. |
| 6,352,945 | B1 | 3/2002 | Matsuki et al. |
| 6,383,955 | B1 | 5/2002 | Matsuki et al. |
| 6,403,486 | B1 | 6/2002 | Lou |
| 6,410,463 | B1 | 6/2002 | Matsuki |
| 6,432,846 | B1 | 8/2002 | Matsuki et al. |
| 6,436,822 | B1 | 8/2002 | Towle |
| 6,455,445 | B2 | 9/2002 | Matsuki |
| 6,514,880 | B2 | 2/2003 | Matsuki et al. |
| 6,740,602 | B1 | 5/2004 | Hendriks et al. |
| 6,784,123 | B2 | 8/2004 | Matsuki et al. |
| 6,818,570 | B2 | 11/2004 | Tsuji et al. |
| 6,835,664 | B1 | 12/2004 | Sarigiannis et al. |

(Continued)

FOREIGN PATENT DOCUMENTS

EP    1 225 194 A2    7/2002

(Continued)

OTHER PUBLICATIONS

A. J. Kalkman et al., $SiOF_x$ and $SiO_2$ deposition in an ECR-HDP reactor: Tool characterization and film analysis, Microelectronic Engineering 37-38(1999) 271-276.

(Continued)

*Primary Examiner*—Zandra Smith
*Assistant Examiner*—Pamela E Perkins
(74) *Attorney, Agent, or Firm*—Knobbe, Martens, Olson & Bear LLP

(57) ABSTRACT

A method for forming an insulation film on a semiconductor substrate by plasma reaction includes: introducing into a reaction chamber a source gas of a silicon-containing hydrocarbon compound comprising in its molecule at least one Si—O bond and at least one bond selected from the group consisting of a Si—Si bond, Si—N bond, and Si—H bond; introducing into the reaction chamber an additive gas constituted by C, H, and optionally O; controlling a susceptor at a temperature of −50° C. to 50° C.; forming by plasma reaction an insulation film constituted by Si, O, H, and optionally N on an irregular surface of a substrate at a deposition rate of 100 nm/min or less; and heat-treating the substrate with the insulation film, thereby increasing a density of the insulation film to more than 2.1 $g/cm^3$ as a result of the heat treatment.

22 Claims, 3 Drawing Sheets

U.S. PATENT DOCUMENTS

| | | |
|---|---|---|
| 6,881,683 B2 | 4/2005 | Matsuki et al. |
| 6,890,869 B2 | 5/2005 | Chung |
| 7,064,088 B2 | 6/2006 | Hyodo et al. |
| 7,354,873 B2 | 4/2008 | Fukazawa et al. |
| 2001/0055889 A1 | 12/2001 | Iyer |
| 2003/0100175 A1 | 5/2003 | Nobutoki et al. |
| 2003/0194880 A1 | 10/2003 | Singh et al. |
| 2004/0137757 A1 | 7/2004 | Li et al. |
| 2005/0129932 A1 | 6/2005 | Briley |
| 2006/0014399 A1 | 1/2006 | Joe |
| 2006/0110931 A1 | 5/2006 | Fukazawa et al. |
| 2006/0228866 A1 | 10/2006 | Ryan et al. |
| 2006/0240652 A1 | 10/2006 | Mandal |
| 2006/0258176 A1 | 11/2006 | Fukazawa et al. |
| 2007/0004204 A1 | 1/2007 | Fukazawa et al. |
| 2007/0065597 A1 | 3/2007 | Kaido et al. |
| 2007/0289534 A1 | 12/2007 | Lubomirsky et al. |
| 2008/0305648 A1 | 12/2008 | Fukazawa et al. |

FOREIGN PATENT DOCUMENTS

| | | |
|---|---|---|
| JP | 2006-054353 | 2/2006 |

OTHER PUBLICATIONS

W. J. Lee et al., Device Isolation Technology on Semiconductor Substrate, U.S. Appl. No. 12/130,522, filed May 30, 2008.

METHOD FOR FORMING INSULATION FILM HAVING HIGH DENSITY

BACKGROUND OF THE INVENTION

1. Field of the Invention

This invention relates generally to a semiconductor technique and more particularly to a silicone polymer film or oxide film used as an insulation film on a semiconductor substrate, which is formed by using plasma CVD (chemical vapor deposition).

2. Description of the Related Art

In the plasma chemical vapor deposition method (plasma CVD method), deposition of a film on semiconductor substrates is conducted by placing each semiconductor substrate, being a processing target, on a resistance-heating type heater preheated to 0 to 350° C. in an atmosphere of 1 to 10 Torr. This heater is placed in a manner facing a shower plate that releases reactant gas, and high-frequency power of 13.56 MHz to 60 MHz, etc., is applied by 100 to 4,000 W to the shower plate to cause high-frequency discharge between the heater and shower plate and thereby generate plasma. The plasma CVD method is used to deposit various types of thin film, such as an interconnect insulation film, passivation film, and anti-reflection film. Since achieving a disproportionately high level of surface diffusion is difficult with parallel-plate type plasma CVD, high-density plasma CVD that uses microwaves has traditionally been used to form an oxide film, etc., having filling characteristics. These techniques have been used since the days of 250-nm device nodes. One feature of such apparatus is that it not only forms a film, but also performs etching of a film, which means that the apparatus can support smaller hole diameters. With current products having device nodes of 65 nm to 90 nm, the mainstream processing method is one that combines film formation and etch-back. Representative processes in which this method is used include STI (Shallow Trench Isolation), and upper-layer processing in the wiring process.

However, combination of film formation and etch-back will not likely support smaller device nodes of 60 nm and below, and there is a need for an insulation film offering sufficient filling characteristics in line with the accelerating trend for super-fine circuitry.

SUMMARY OF THE INVENTION

In one embodiment of the present invention, the susceptor temperature is controlled in a range of approx. −50° C. to approx. 50° C. while forming a film precursor. By creating a low temperature environment, the active species formed by plasma CVD exhibits fluidity on the silicon substrate to fill narrow holes and bury wires. Also, the surface tension is determined by the viscosity of the formed precursor. Accordingly, in one embodiment a film material containing a combination of isopropyl alcohol, acetone or other additive and oxidizing material can be used to control the viscosity to low levels. One embodiment of the present invention achieves filling effect even at a high aspect ratio by lowering the film formation temperature and viscosity, as explained above. This is because the present invention promotes high level of surface diffusion supported by fluidity. In another embodiment, the present invention achieves good filling characteristics at susceptor temperatures of approx. −50° C. to approx. 0° C., despite a high aspect ratio. To be specific, a pattern with wiring widths and hole sizes of 20 to 100 nm is used to check the filling characteristics. At the same time, plasma preprocessing is performed using film species formed at the base in order to improve wettability. In one embodiment of the present invention, the film growth speed is kept to 100 nm/min or below in order to suppress variation in film growth speed due to difference in hole size. In another embodiment, the flow rate of added gas is determined based on the flow rate of material, so as to achieve the aforementioned requirement.

In yet another embodiment, the present invention provides a method for forming an oxide film offering filling performance. One feature of the present invention is that to achieve high density, Si—O, Si—Si and Si—N bonds are given to film material to lower the wet-etch rate. To control viscosity, IPA, acetone, hexane or other CH or CHO group is added to film material. Improvement of wettability is achieved by means of plasma preprocessing to ensure optimal filling action.

Filling action is achieved in a high-temperature or ozone environment under the traditional CVD process. In one embodiment of the present invention, on the other hand, a film is formed at a growth speed of 100 nm or less using silicon hydrocarbon gas at low temperature, thereby dramatically improving the filling characteristics of the formed film, as mentioned above.

For purposes of summarizing the invention and the advantages achieved over the prior art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

Figure 1:
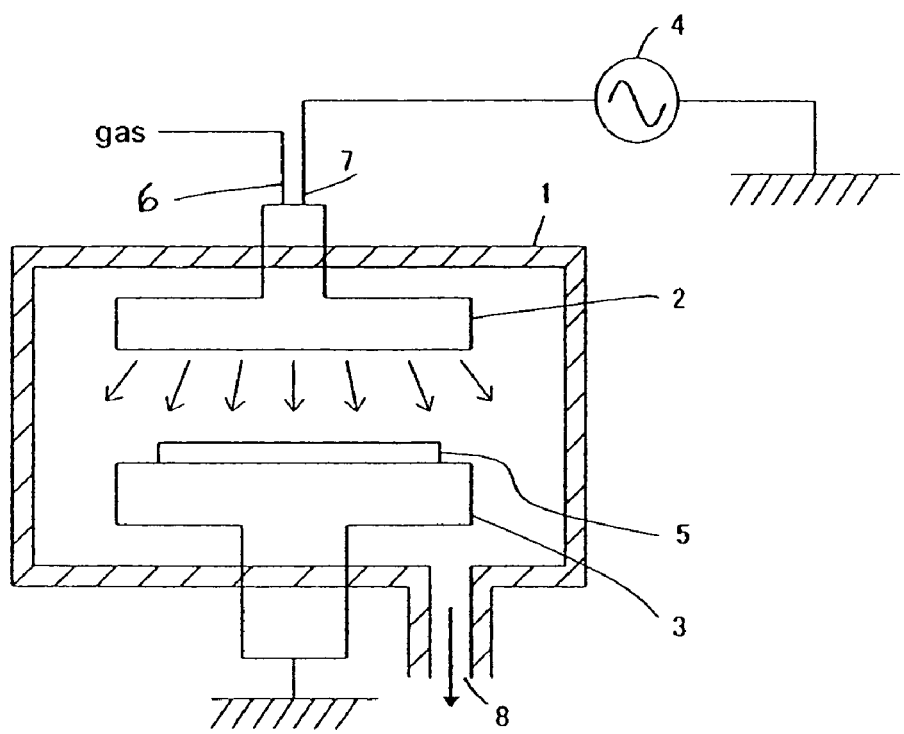
FIG. 1 is a schematic diagram illustrating a plasma CVD apparatus usable forming an insulation film according to the present invention.

As mentioned above, the present invention encompasses various embodiments. In one embodiment of the present invention, insulating substance having fluidity is caused to fill irregular patterns by means of surface tension. To cause insulating substance to fill an irregular pattern, a film is formed on the substrate surface. At this time, a film formed on a blanket has different quality than the film formed in an irregular pattern. In one embodiment, the growth speed of film formed in an irregular pattern is around twice to four times the growth speed of blanket film. For this reason, the film formed inside an irregular pattern tends to become sparse, and after heat is applied holes called "pores" form around the sparse regions of the film. In one embodiment, film growth speed has significant bearing on film density, and controlling the growth speed of blanket film to 100 nm or below will prevent the oxide film in an irregular pattern from becoming sparsely formed.

In another embodiment, following the film formation process the film precursor is hardened by means of heat, ultraviolet light or other curing technique to form a filling low-dielectric-constant film and/or a filling oxide film (hereinafter also referred to as "oxide film"). When heat annealing is used, removal of impurities in the film and curing effect can be achieved in a temperature range of 200° C. to 1,100° C. The annealing temperature range varies depending on the process in which annealing is used. In one embodiment, this method has been confirmed to achieve high filling performance in holes with an aspect ratio of 1:3 to 1:10. At the same time, the formed film also exhibits good electrical characteristics. Particularly when the processing temperature is high, at 700° C. or above, characteristics equivalent to those of a thermal oxide film can be achieved. Accordingly, the formed film can be used in the substrate process (FEOL). Furthermore, the formed film also functions as a sacrificial film in shaping steps.

In one embodiment, formation of an oxide film is followed by processes where a film is subsequently formed or processed. Since these processes include washing, etc., wet etching resistance becomes important. From this viewpoint, in one embodiment the precursor is given certain characteristics to improve wet-etch rate. Based on evaluation results, one embodiment resulted in wet-etch rates of 25 to 45 nm/min, which are comparable to the wet-etch rate of 40 nm/min with a thermal oxide film. For your reference, wet-etch rate can be evaluated using LAL500 by Stella Chemifa, which is a buffered hydrofluoric acid containing surface active agent.

In an embodiment, the present invention provides a method for forming an insulation film on a semiconductor substrate by plasma reaction, comprising the steps of: (i) providing a substrate having an irregular surface including concave portions placed on a susceptor in a reaction chamber; (ii) introducing into the reaction chamber a source gas of a silicon-containing hydrocarbon compound comprising in its molecule at least one Si—O bond and at least one bond selected from the group consisting of a Si—Si bond, Si—N bond, and Si—H bond; (iii) introducing into the reaction chamber an additive gas constituted by C, H, and optionally O (e.g., isopropyl alcohol or acetone); (iv) controlling the susceptor at a temperature of about −50° C. to about 50° C. (including −50° C., −40° C., −30° C., −20° C., −10° C., 0° C., 10° C., 20° C., 30° C., 40° C., 50° C., and values between any two numbers of the foregoing, preferably −20° C. to 20° C.); and (v) forming by plasma reaction an insulation film constituted by Si, O, H, and optionally N on the irregular surface of the substrate including the concave portions at a deposition rate of about 100 nm/min or less (including 100 nm/min, 95 nm/min, 90 nm/min, 80 nm/min, 70 nm/min, 60 nm/min, 50 nm/min, 40 nm/min, 30 nm/min, 20 nm/min, and values between any two numbers of the foregoing, preferably 40 nm/min to 95 nm/min). By controlling the deposition rate of film at 100 nm/min or less, the depositing film can have a more dense structure and can have a good resistance to wet etching upon curing. The deposition rate is a deposition rate of film as formed on a plane surface of a substrate.

In an embodiment, any of the foregoing methods may further comprise heat-treating the substrate with the insulation film, thereby increasing a density of the insulation film to more than 2.12 $g/cm^3$ (including 2.13 $g/cm^3$, 2.14 $g/cm^3$, 2.15 $g/cm^3$, 2.20 $g/cm^3$, 2.30 $g/cm^3$, 2.40 $g/cm^3$, 2.50 $g/cm^3$, 2.70 $g/cm^3$, 2.90 $g/cm^3$, 3.0 $g/cm^3$, and values between any two numbers of the foregoing) as a result of the heat treatment. In general, when the film density is high, a wet-etch rate on an irregular surface of the film becomes low. In another embodiment, the film density may be less than 2.12 $g/cm^3$, and in that case, the film density may be 2.0 $g/cm^3$ to 2.60 $g/cm^3$, depending on the composition of the film, the curing process, etc. In the above, in an embodiment, the density is a maximum density as a result of heat treatment.

In an embodiment, the dielectric constant of the film upon the heat-treatment may be 5 or less (4.8, 4.5, 4.3, 4.0, 3.8, 3.5, 3, and values between any two numbers of the foregoing).

In an embodiment, any of the foregoing method may further comprise, as a preliminary treatment, introducing an auxiliary gas selected from the group consisting of oxidizing gas, inert gas, and a gas constituted by C, H, and optionally O (e.g., isopropyl alcohol, acetone, or hexane) into the reaction chamber for plasma treatment of the substrate before introducing the reaction gas. By performing the preliminary treatment, affinity of the irregular surface to an insulation film can be improved, thereby improving padding or filling property of the film in a concave portion.

According to an embodiment, in any of the foregoing method, the concave portion of the irregular surface may have holes or grooves, and the deposition step is performed on the irregular surface to fill the holes or grooves with the insulation film. In an embodiment, the irregular surface may have a three-dimensional structure of SiN, SiO, Poly-Si, Cu, or Si.barrier metal, or in another embodiment, aluminum, tungsten, or tungsten silicon. According to an embodiment, in any of the foregoing method, the irregular surface with the concave portion may be a patterned surface for wiring. Further, in an embodiment, the concave portion of the irregular surface of the substrate may have an aspect ratio of about 1/3 to about 1/10.

According to an embodiment, in any of the forgoing method, the heat-treating step may be performed by thermal annealing or UV curing. In the above, in an embodiment, the annealing step may be performed at a temperature of 200° C. to 1,100° C. (including 300° C., 500° C., 700° C., 900° C., and values between any two numbers of the foregoing). In order to eliminate carbon from a film and constitute the film by Si, O, and H, a high temperature such as 900° C. or higher by thermal annealing is preferable.

In an embodiment, the insulation film may be a silicon oxide film, and in a preferable embodiment, no carbon is contained. In another embodiment, carbon may be contained at less than 5% of the film composition. In an embodiment, the insulation film may have a thickness of 25 nm to 70 nm. In another embodiment, the thickness may be 10 nm to 200 nm. The thickness is a thickness of film as formed on a plane surface of a substrate.

According to an embodiment, in any of the foregoing method, the silicon-containing hydrocarbon compound may be at least one compound selected from the group consisting of:

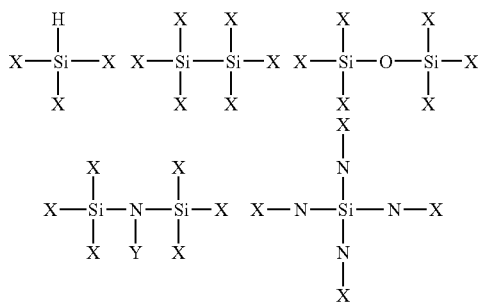

wherein each X is independently H, OH, $CH_3$, $C_2H_5$, $OCH_3$, or $OC_2H_5$, and Y is H, $CH_3$, or $C_2H_5$. Preferably, at least one X is neither H nor OH.

In the deposition step, when the average temperature of the reaction (in an embodiment, the temperature of the susceptor) is controlled at about −50° C. to about 50° C. and the deposition rate is controlled at about 100 nm/min or less using a specifically selected reaction gas, the insulation film can possess good filling property (padding property) so that even if a surface having holes or wiring grooves on which the insulation film is deposited has a high aspect ratio such as 1/3 to 1/10 (e.g., a Shallow Trench Isolation (STI) structure formed in a Si substrate) or a wiring pitch of 100 nm or less (e.g., 45 nm to 100 nm for an Al/low-k structure), the insulation film can fill in the holes or grooves without creating voids (as a low-k film or an oxide film). When the temperature is low, the precursor which is once vaporized when entering the reaction chamber becomes in an activated liquid state in the vicinity of a substrate surface, and thus the depositing film can exhibit excellent step coverage and filling property.

In an embodiment of the present invention, an insulation film may be formed on a low-k film or on a Cu layer or formed on a surface of a via and/or trench in a damascene process as a barrier film, or on a three-dimensional structure of Al, tungsten, or tungsten silicon (or any other wiring materials) which can be processed by dry-etching. The insulation film may be formed using the same source gas as those used for forming a low-k film formed by the method described below in an embodiment. In that case, the insulation film and the low-k film can continuously be formed using the same equipment, thereby eliminating particle contamination problems and increasing productivity.

Further, in an embodiment, the present invention provides a method for forming an interconnect structure, comprising the steps of: (i) forming a three-dimensional structure for interconnect in a substrate; and (ii) forming an insulation layer on a surface of the three-dimensional structure using any of the foregoing methods. In an embodiment, any of the foregoing methods may further comprise wet-etching the insulation film. In an embodiment, the step of forming a three-dimensional structure may comprise forming a layer of aluminum, tungsten, or tungsten silicon as a wiring layer and etching the layer in a pattern.

Further, in order to further improve filling property by improving affinity between an underlying layer and an insulation film, the method may further comprise, as a preliminary treatment, introducing an auxiliary gas which is one or more selected from the group consisting of He, $O_2$, and a gas constituted by C, H, and optionally O into the reaction space for plasma treatment of the semiconductor substrate (at a low temperature so that an activated liquid formed from the auxiliary gas can preliminarily cover a three-dimensional structure and then mixed with an activated liquid subsequently formed from the reaction gas) before introducing the reaction gas. In an embodiment, as the gas constituted by C, H, and optionally O, the additive gas used at the deposition stage can be used. The preliminary treatment is effective specifically when the underlying layer has a hydrophobic surface, for example, and in that case, by the preliminary treatment, the surface can be changed from a hydrophobic state to a hydrophilic state. The characteristics of the insulation film are typically not affected by the preliminary treatment.

The preliminary treatment of the substrate can be conducted under conditions set for forming an insulation film thereon except that no silicon-containing hydrocarbon compound is used and higher RF power (2-fold to 5-fold) may be used as compared with the RF power (e.g., 27 MHz) for depositing an insulation film (which may be in the range of 100 W to 1,000 W, e.g., 200 W to 500 W). The auxiliary gas may be isopropyl alcohol or acetone or can be an inert gas such as He alone or in combination with other gas. The flow rate of each auxiliary gas may be 10 sccm to 2000 sccm (including 50 sccm, 100 sccm, 500 sccm, 800 sccm, 1000 sccm, 1500 sccm, and ranges between any two numbers of the foregoing). The above auxiliary gas can be used in any combination. If the preliminary treatment is conducted, no auxiliary gas may be added to the reaction gas for depositing an insulation film.

In an embodiment, by a combination of the above preliminary treatment for improving affinity between an underlying layer and an insulation film and the above deposition process using an additive gas a CxHyOz gas for reducing the viscosity of the reaction gas, the filling property or padding property of the insulation film (oxide film or low-k film) can significantly be improved.

The inert gas may be one or more selected from the group consisting of He, Ar, Kr, and Xe. The inert gas may be introduced at a flow rate of 10 sccm to 10,000 sccm (including 50 sccm, 100 sccm, 500 sccm, 1,000 sccm, 3,000 sccm, 6,000 sccm, and values between any two numbers of the foregoing). Because each inert gas has a different ionization energy and different collision cross section, by selecting an inert gas, it is possible to control gas phase reaction in the reaction space. For example, Argon is principally used for stabilizing plasma, while helium is used for improving uniformity of the plasma and also uniformity of thickness of the insulation film.

In another embodiment, as the additive gas, $H_2$ gas may be added. In an embodiment, the additive gas may be at least one selected from the group consisting of $H_2$ gas and a gas of CxHyOz wherein x=1-10, y=a natural number, and z=0, 1, or 2, which is introduced into the reaction space when the source gas is introduced. The above gases can be used singly or in any combination. These gases do not typically serve as an oxygen-supplying gas which supplies oxygen to be bound to Si (i.e., even if a molecule of the gas contains oxygen, the oxygen is insignificantly involved in formation of a basal structure of the resulting film) or crosslinking gas (i.e., a molecule of the gas is insignificantly involved in formation of a basal structure of the resulting film). In an embodiment, the additive gas may be selected from the group consisting of acetone, hexane, isoprene, and isopentan. The additive gas may be introduced at a flow rate of 5 sccm to 900 sccm (including 20 sccm, 50 sccm, 100 sccm, 300 sccm, 600 sccm, and values between any two numbers of the foregoing).

In the above, the additive gas of CxHyOz preferably has a viscosity of 0.2-2.3 mPa·s (as measured at 20° C. so that when the additive gas is mixed in the reaction gas, the viscosity of the reaction gas can be reduced, thereby improving filling property (padding property) in small gaps or holes in interconnect structures.

In an embodiment, an oxidizing gas may be added to the source gas. The oxidizing gas may be one or more selected from the group consisting of $O_2$, $O_3$, $CO_2$, $N_2O$, and $H_2O$. The oxidizing gas may be introduced at a flow rate of 10 sccm to 3,000 sccm (including 50 sccm, 100 sccm, 500 sccm, 1,000 sccm, 2,000 sccm, and values between any two numbers of the foregoing).

In an embodiment, a nitrogen-containing gas may be added to control the nitrogen content in the depositing film. The nitrogen-containing gas may be one or more selected from the group consisting of $N_2$, $NH_3$, and $N_2O$. The nitrogen-containing gas may be introduced at a flow rate of 10 sccm to 3,000 sccm (including 50 sccm, 100 sccm, 500 sccm, 1,000 sccm, 2,000 sccm, and values between any two numbers of the foregoing).

The source gas may be introduced at a flow rate of 3 sccm to 200 sccm (including 5 sccm, 7 sccm, 10 sccm, 15 sccm, 20 sccm, 30 sccm, 50 sccm, 70 sccm, 100 sccm, 150 sccm, and values between any two numbers of the foregoing; in an embodiment, 5-20 sccm).

In an embodiment, the inert gas, the oxidizing gas, and the additive gas may be used in any combination (e.g., a flow ratio of [source gas]/[inert gas]/[oxidizing gas]/[additive gas]= [10]/[100-10000 (e.g., 500-2000)]/[15-100 (e.g., 20-80)]/ [20-300 (e.g., 40-200)]). In an embodiment, the flow rates may be in the following order: [source gas]<[oxidizing gas] <[additive gas]<[inert gas]. Further, in an embodiment, the sum of the flow rates of [source gas]+[oxidizing gas]+[additive gas] may be less than 500 sccm (e.g., 50-300 sccm). In the above, the deposition rate of film can effectively be controlled especially when the susceptor is controlled at a temperature of 50° C. or lower so that a concave portion of a substrate can be filled with the film while inhibiting formation of pores inside.

In an embodiment, one or two or any combination of an inert gas, oxidizing gas, and reduction gas can be used. When using hydrogen-containing gas as the additive gas at a relatively high flow rate, thermal stability of a film tends to degrade. Thus, a mixing ratio of gases needs to be adjusted.

In an embodiment, a flow rate of the source gas is lesson more than 2.8% (e.g., 2.5%, 2.2%, 2.0%, 1.5%, 1.0%, and values between any two numbers of the foregoing) of the total flow rate of the process gas (also referred to as "reaction gas"). In another embodiment, the flow rate of the source gas can be more than 2.8% (e.g., 3.0%, 5.0%, and values between any two numbers of the foregoing), depending upon the type of source gas and other gases, deposition temperature, etc.

In another embodiment, one or two of the inert gas, the oxidizing gas, or the additive gas may be excluded. In an embodiment where the preliminary treatment for improving affinity between an underlying layer and an insulation film is performed with use of a gas equivalent to the additive gas (this is effective for filling a small hole), the additive gas may be eliminated at the deposition stage. In another embodiment where the preliminary treatment is performed without use of a gas equivalent to the additive gas, the flow rate of the additive gas may be reduced at the deposition stage. For example, in the case of application of the preliminary treatment, a flow ratio of [source gas]/[additive gas] may be [10]/ [0-100 (e.g., 0-50)].

In an embodiment, the RF power for forming an insulation film may have a frequency of 13.56 MHz to 60 MHz such as 13.56 MHz, 27 MHz, and 60 MHz (in an embodiment, 20 MHz or higher). In an embodiment, the RF power may be 50 W or higher (100 W, 200 W, 300 W, 500 W, and values between any two numbers of the foregoing, in an embodiment, 100 W to 200 W). A relatively low RF power may be effective in controlling the low deposition rate. In an embodiment, low-frequency RF power may be 1%-50% of the high-frequency RF power (including 5%, 10%, 15%, 20%, 30%, 40%, and values between any two numbers of the foregoing). The low-frequency RF power may have a frequency of 2 MHz or less (e.g., 400 kHz, 430 kHz).

The substrate may have an irregular surface which is a patterned surface for wiring comprised of a concave portion wherein the insulation film is to be filled. The substrate may have an exposed Cu layer on which the insulation film is to be formed.

In all of the aforesaid embodiments and aspects, any element used in an embodiment or aspect can interchangeably or additionally be used in another embodiment or aspect unless such a replacement is not feasible or causes adverse effect.

Further aspects, features and advantages will become apparent from the detailed description of the preferred examples which follows. The preferred embodiments are not intended to limit the present invention.

FIG. 1 diagrammatically shows a plasma CVD apparatus usable in an embodiment of this invention. The plasma CVD device includes a reaction chamber 1, a gas inlet port 6, a susceptor 3 (serving as a lower electrode) provided with an embedded temperature controller which can be a coil in which a coolant or heating medium flows in a channel to control the temperature. A showerhead 2 (serving as an upper electrode) may be disposed immediately under the gas inlet port. The showerhead 2 has a number of fine openings at its bottom face and can inject reaction gas to the semiconductor substrate 5 therefrom. There is an exhaust port 8 at the bottom of the reaction chamber 1. This exhaust port 8 is connected to an outer vacuum pump (not shown) so that the inside of the reaction chamber 1 can be evacuated. The susceptor 3 is placed in parallel with and facing the showerhead 2. The susceptor 3 holds a semiconductor substrate 5 thereon and heats or cools it with the temperature controller. The gas inlet port 6 is insulated from the reaction chamber 1 and connected to an outer high frequency power supply 4. Alternatively, the susceptor 3 can be connected to the power supply 4. Thus, the showerhead 2 and the susceptor 3 act as a high frequency electrode and generate a plasma reacting field in proximity to the surface of the semiconductor substrate 5.

The gases can be mixed upstream of the gas inlet port 6 to constitute a process gas, or each or some of the gases can be introduced separately into the showerhead 2. The space between the showerhead 2 and the semiconductor substrate 5, both located inside of the reaction chamber 1 which is already evacuated, is charged with RF power which has a single frequency or mixed frequencies (e.g., 13.56 MHz to 60 MHz), and the space serves as a plasma field. The susceptor 3 continuously heats or cools the semiconductor substrate 5 with the temperature controller and maintains the substrate 5 at a predetermined temperature that is desirably −50° C.-50° C. The process gas supplied through the fine openings of the showerhead 2 remains in the plasma field in proximity to the surface of the semiconductor substrate 5 for a predetermined time.

When the insulation film is deposited on the substrate, the gas inside the reaction chamber is discharged through the exhaust port 8 and replaced with a reduction gas or a mixture of a reduction gas and an inert gas, while maintaining the substrate in the reaction chamber.

In an embodiment, the preliminary step can be performed using the same reaction chamber for the deposition step. In another embodiment, the preliminary step can be performed in a separate chamber.

Figure 2:
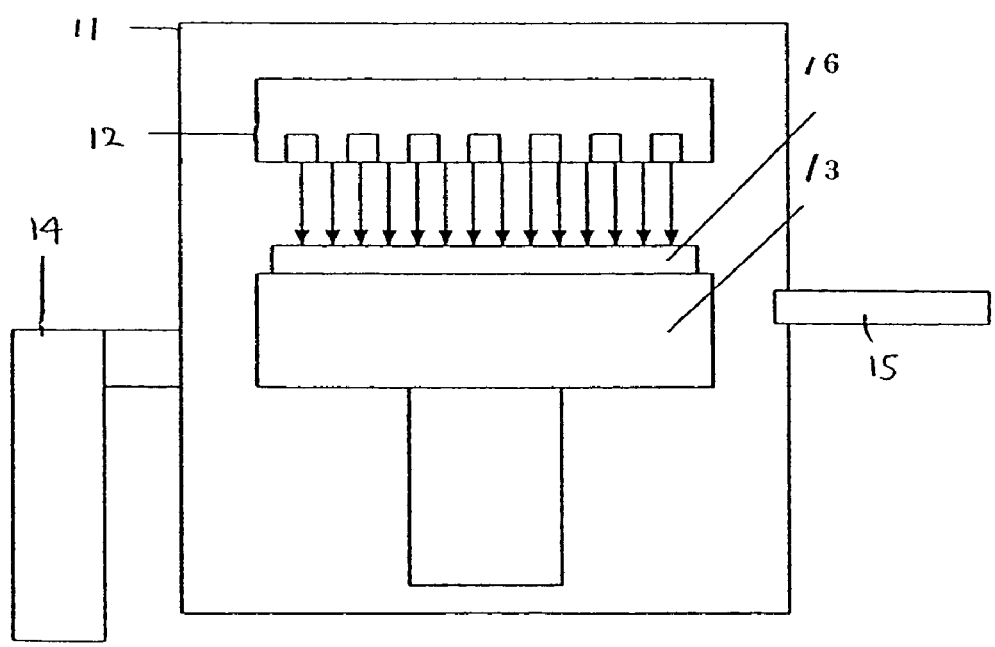
FIG. 2 is a schematic diagram showing a UV curing apparatus according to an embodiment of the present invention.

In an embodiment, subsequently, a curing process is performed on the semiconductor substrate taken out from the reactor using the UV cure apparatus shown in FIG. 2. The UV cure apparatus comprises a process chamber 11, a UV lamp 12, a susceptor 13, an exhaust port 14, and a gas inlet port 15. The UV lamp and a susceptor 13 are disposed parallel, and are heated by heaters embedded in them respectively. The semiconductor substrate 16, which is a workpiece, is placed on the susceptor 13 and is heated and held. Projected from the UV lamp whose wavelength range is selected from 172-250 nm, light is irradiated toward the semiconductor substrate 16. When the semiconductor substrate is irradiated, gases such as He, $H_2$, $N_2$, $CO_2$, etc. are being introduced through the gas inlet port 15. As soon as pores are formed in the film with H, O, C, etc. being desorbed from a low-dielectric-constant structure, unstable bonds no longer exist; hence, a film having a lower dielectric constant and higher strength can be obtained.

As the UV cure apparatus, the apparatus disclosed in commonly assigned U.S. patent application Ser. No. 11/040,863 can be used, the disclosure of which is incorporated herein by reference in its entirety.

The heat-treating step can be performed by thermal annealing in place of the UV curing.

In an embodiment, subsequently, the heat-treating step is performed on the semiconductor substrate taken out from the reactor by annealing under conditions where the susceptor temperature may be 200° C. to 1,100° C. (preferably 700° C. to 1,000° C., or higher than 900° C. lower than 1,000° C.), the pressure may be 300 Pa to atmospheric pressure, the flow rate of an inert gas such as N2 may be 0.5 SLM to 5 SLM (preferably 1 SLM to 3 SLM), and the duration may be 100 seconds to 120 minutes (preferably 30 minutes to 100 minutes.

As a result of the heat-treating step, a low-k film which has a dielectric constant of 2.3 to 3.0 can be formed in the concave portion, using a silicon-containing hydrocarbon compound in an embodiment. In another embodiment, as a result of the heat-treating step, an oxide film which as a dielectric constant of 3.85 to 4.0 can be formed in the concave portion, using a precursor for oxide films.

In the present disclosure where conditions and/or structures are not specified, the skilled artisan in the art can readily provide such conditions and/or structures, in view of the present disclosure, as a matter of routine experimentation. Additionally, the conditions and/or structures disclosed in U.S. patent application Ser. No. 11/465,751 owned by the same assignee can be used in embodiments of the present invention.

Example

Experiments were conducted as described below. The results are indicated in tables below. In these experiments, an ordinary plasma CVD device (Eagle®10, ASM Japan K.K.) was used as an experimental device.

The diameter of a substrate was 200 mm. The thickness of each insulation film was set at 50 nm, except that the thickness of each insulation film for measuring a dielectric constant was set at 200 nm.

An insulation film was formed on and filled in an irregular surface of SiN formed on a Si wafer including a hole having a width of 60 nm and a depth of 600 nm. Annealing was conducted in a batch-type furnace chamber made of a quartz tube provided with a quartz boat capable of performing annealing at a vacuum pressure to atmospheric pressure. A wet etch rate was evaluated using an undiluted liquid of LAL500 (manufactured by Stella-Chemifa in Japan).

Comparative Example 1

As a preliminary treatment (for improving padding property of an insulation film), a substrate was treated with a plasma using a plasma CVD apparatus shown in FIG. 1 under the following conditions:
Susceptor temperature: 0° C.
Auxiliary gas: He: 1000 sccm
Reactor pressure: 1000 Pa
27.12 MHz RF applied: 200 W An insulation film was formed on a substrate using a plasma CVD apparatus shown in FIG. 1 under the following conditions, and the resultant thin film had the following properties:
Susceptor temperature: 0° C.
TRES (triethoxysilane) flow rate: 50 sccm
Isopropyl alcohol flow rate: 150 sccm
$O_2$ flow rate: 1000 sccm
He flow rate: 500 sccm
27 MHz RF applied: 250 W
Reactor pressure: 666 Pa
Space between the silicon substrate and the upper electrode: 20 mm
Deposition rate: 260 nm/min The thin film formed on the substrate was then cured using the annealing apparatus under the following conditions, and the cured film had the following properties:
Thermal curing process: Susceptor temperature: 900° C., $N_2$: 3 SLM, Pressure: 800 Pa, Time: 600 sec.
Dielectric constant: 3.9
Carbon content in film: 0%
Wet etch rate on the blanket wafer: 40 nm/min
Wet etch rate on the irregular surface having 100 nm holes: 350 nm/min
Density: 2.1 $g/cm^3$.

Comparative Example 2

As a preliminary treatment (for improving padding property of an insulation film), a substrate was treated with a plasma using a plasma CVD apparatus shown in FIG. 1 under the following conditions:
Susceptor temperature: 0° C.
Auxiliary gas: He: 1000 sccm
Reactor pressure: 1000 Pa
27.12 MHz RF applied: 200 W An insulation film was formed on a substrate using a plasma CVD apparatus shown in FIG. 1 under the following conditions, and the resultant thin film had the following properties:
Susceptor temperature: 0° C.
TRES (triethoxysilane) flow rate: 50 sccm
Isopropyl alcohol flow rate: 150 sccm
$O_2$ flow rate: 600 sccm
He flow rate: 500 sccm
27 MHz RF applied: 250 W
Reactor pressure: 666 Pa
Space between the silicon substrate and the upper electrode: 20 mm
Deposition rate: 145 nm/min The thin film formed on the substrate was then cured using the furnace chamber under the following conditions, and the cured film had the following properties:
Thermal curing process: Susceptor temperature: 900° C., $N_2$: 3 SLM, Pressure: 800 Pa, Time: 600 sec.
Dielectric constant: 3.95
Carbon content in film: 0%
Wet etch rate on the blanket wafer: no data
Wet etch rate on the irregular surface having 100 nm holes: 160 nm/min
Density: 2.12 g/cm$^3$.

Example 1

As a preliminary treatment (for improving padding property of an insulation film), a substrate was treated with a plasma using a plasma CVD apparatus shown in FIG. 1 under the following conditions:
Susceptor temperature: 0° C.
Auxiliary gas: He: 1000 sccm
Reactor pressure: 1000 Pa
27.12 MHz RF applied: 200 W
An insulation film was formed on a substrate using a plasma CVD apparatus shown in FIG. 1 under the following conditions, and the resultant thin film had the following properties:
Susceptor temperature: 5° C.
Source gas: TRES (triethoxysilane): 10 sccm
Additive gas: Isopropyl alcohol: 150 sccm
Oxidizing gas: $O_2$: 50 sccm
Inert gas: He: 630 sccm
27 MHz RF applied: 200 W
Reactor pressure: 266.6 Pa
Space between the silicon substrate and the upper electrode: 10 mm
Deposition rate: 49 nm/min
The thin film formed on the substrate was then cured using the furnace chamber under the following conditions, and the cured film had the following properties:
Thermal curing process: Susceptor temperature: 950° C., $N_2$: 1 SLM, Pressure: Atmospheric pressure, Time: 90 min.
Dielectric constant: 3.9
Leakage current at 2 MV: $7.0 \times 10^{-12}$ A/cm$^2$
Breakdown voltage: 8.4 MV
Carbon content in film: 0%
Wet etch rate on the blanket wafer: 30 nm/min (cf. thermal oxide film: 40 nm/min)
Wet etch rate on the irregular surface having 100 nm holes: 75 nm/min
Density: 2.3 g/cm$^3$.

Example 2

As a preliminary treatment (for improving padding property of an insulation film), a substrate was treated with a plasma using a plasma CVD apparatus shown in FIG. 1 under the following conditions:
Susceptor temperature: 0° C.
Auxiliary gas: He: 1000 sccm
Reactor pressure: 1000 Pa
27.12 MHz RF applied: 200 W
An insulation film was formed on a substrate using a plasma CVD apparatus shown in FIG. 1 under the following conditions, and the resultant thin film had the following properties:
Susceptor temperature: 0° C.
Source gas: TRES (triethoxysilane): 10 sccm
Additive gas: Isopropyl alcohol: 50 sccm
Oxidizing gas: $O_2$: 20 sccm
Inert gas: He: 630 sccm
27 MHz RF applied: 150 W
Reactor pressure: 133.3 Pa
Space between the silicon substrate and the upper electrode: 10 mm
Deposition rate: 29 nm/min
The thin film formed on the substrate was then cured using the furnace chamber under the following conditions, and the cured film had the following properties:
Thermal curing process: Susceptor temperature: 950° C., $N_2$: 1 SLM, Pressure: Atmospheric pressure, Time: 90 min.
Dielectric constant: 3.9
Leakage current at 2 MV: $4.3 \times 10^{-12}$ A/cm$^2$
Breakdown voltage: 8.5 MV
Carbon content in film: 0%
Wet etch rate on the blanket wafer: 25 nm/min (cf. thermal oxide film: 40 nm/min)
Wet etch rate on the irregular surface having 100 nm holes: 70 nm/min
Density: 2.4 g/cm$^3$.

Example 3

As a preliminary treatment (for improving padding property of an insulation film), a substrate was treated with a plasma using a plasma CVD apparatus shown in FIG. 1 under the following conditions:
Susceptor temperature: 0° C.
Auxiliary gas: He: 1000 sccm
Reactor pressure: 1000 Pa
27.12 MHz RF applied: 200 W
An insulation film was formed on a substrate using a plasma CVD apparatus shown in FIG. 1 under the following conditions, and the resultant thin film had the following properties:
Susceptor temperature: 0° C.
Source gas: 1,1,3,3-tetradimethyldisilane: 10 sccm
Additive gas: Isopropyl alcohol: 50 sccm
Oxidizing gas: $O_2$: 20 sccm
Inert gas: He: 1200 sccm
27 MHz RF applied: 100 W
Reactor pressure: 266.6 Pa
Space between the silicon substrate and the upper electrode: 10 mm
Deposition rate: 70 nm/min
The thin film formed on the substrate was then cured using the furnace chamber under the following conditions, and the cured film had the following properties:
Thermal curing process: Susceptor temperature: 950° C., $N_2$: 1 SLM, Pressure: Atmospheric pressure, Time: 90 min.
Dielectric constant: 4.1
Leakage current at 2 MV: $8.9 \times 10^{-12}$ A/cm$^2$
Breakdown voltage: 8 MV
Carbon content in film: 0%

Wet etch rate on the blanket wafer: 35 nm/min (cf. thermal oxide film: 40 nm/min)
Wet etch rate on the irregular surface having 100 nm holes: 80 nm/min
Density: 2.2 g/cm$^3$.

Example 4

As a preliminary treatment (for improving padding property of an insulation film), a substrate was treated with a plasma using a plasma CVD apparatus shown in FIG. 1 under the following conditions:
Susceptor temperature: 0° C.
Auxiliary gas: He: 1000 sccm
Reactor pressure: 1000 Pa
27.12 MHz RF applied: 200 W An insulation film was formed on a substrate using a plasma CVD apparatus shown in FIG. 1 under the following conditions, and the resultant thin film had the following properties:
Susceptor temperature: 10° C.
Source gas: hexaethoxydisiloxane: 10 sccm
Additive gas: Isopropyl alcohol: 150 sccm
Oxidizing gas: O$_2$: 65 sccm
Inert gas: He: 1000 sccm
27 MHz RF applied: 150 W
Reactor pressure: 133.3 Pa
Space between the silicon substrate and the upper electrode: 10 mm
Deposition rate: 90 nm/min The thin film formed on the substrate was then cured using the furnace chamber under the following conditions, and the cured film had the following properties:
Thermal curing process: Susceptor temperature: 950° C., N$_2$: 1 SLM, Pressure: Atmospheric pressure, Time: 90 min.
Dielectric constant: 3.95
Leakage current at 2 MV: 3.0×10$^{-12}$ A/cm$^2$
Breakdown voltage: 9 MV
Carbon content in film: 0%
Wet etch rate on the blanket wafer: 40 nm/min (cf. thermal oxide film: 40 nm/min)
Wet etch rate on the irregular surface having 100 nm holes: 85 nm/min
Density: 2.15 g/cm$^3$.

The results are shown in the table below.

TABLE

|  | Deposition Rate (nm/min) | Density upon Annealing (g/cm3) | Etch Rate on Blanket Wafer (nm/min) | Etch Rate on Irregular Surface (nm/min) |
|---|---|---|---|---|
| Com. EX 1 | 260 | 2.1 | 40 | 350 |
| Com. Ex 2 | 145 | 2.12 | — | 160 |
| Ex 1 | 49 | 2.3 | 30 | 75 |
| Ex 2 | 29 | 2.4 | 25 | 70 |
| Ex 3 | 70 | 2.2 | 35 | 80 |
| Ex 4 | 90 | 2.15 | 40 | 85 |

Figure 3:
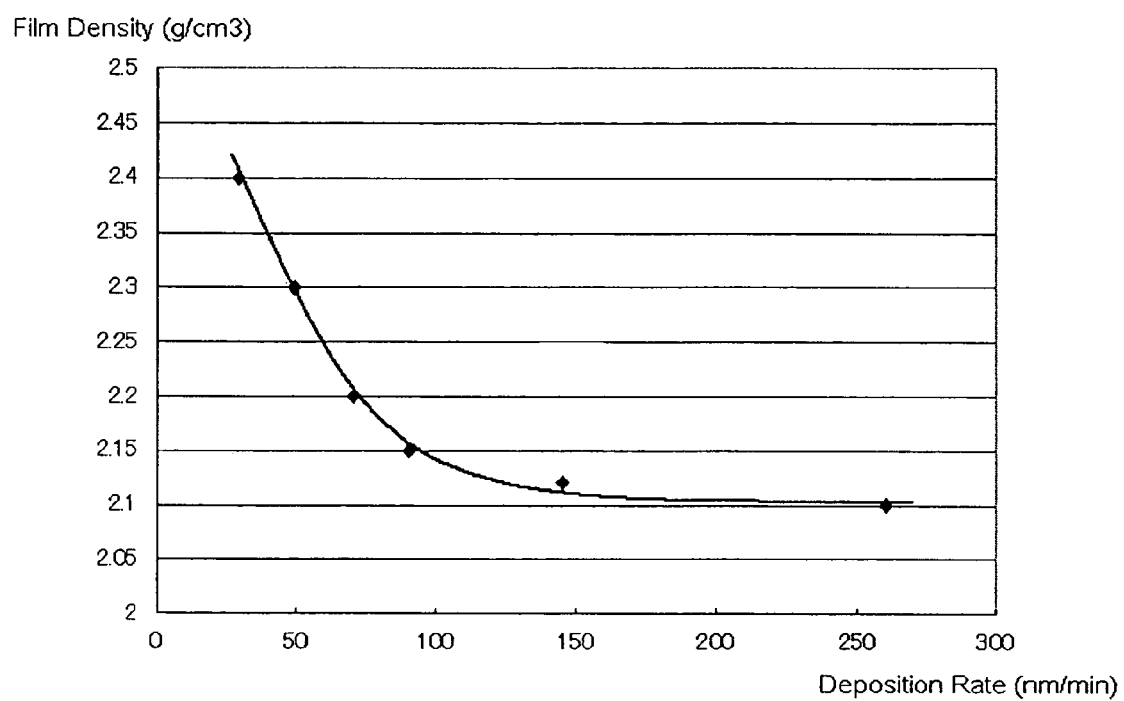
FIG. 3 is a graph showing the relationship between density (g/cm$^3$) and deposition rate (nm/min) according to embodiments of the present invention.

FIG. 3 is a graph showing the relationship between density (g/cm$^3$) and deposition rate (nm/min). As shown in FIG. 3, the film density is generally correlated to the deposition rate, and the lower the deposition rate the higher the film density becomes especially when the deposition rate is about 100 nm/min or less. When the deposition rate is between 150 and 250, the film density does not significantly change.

Figure 4:
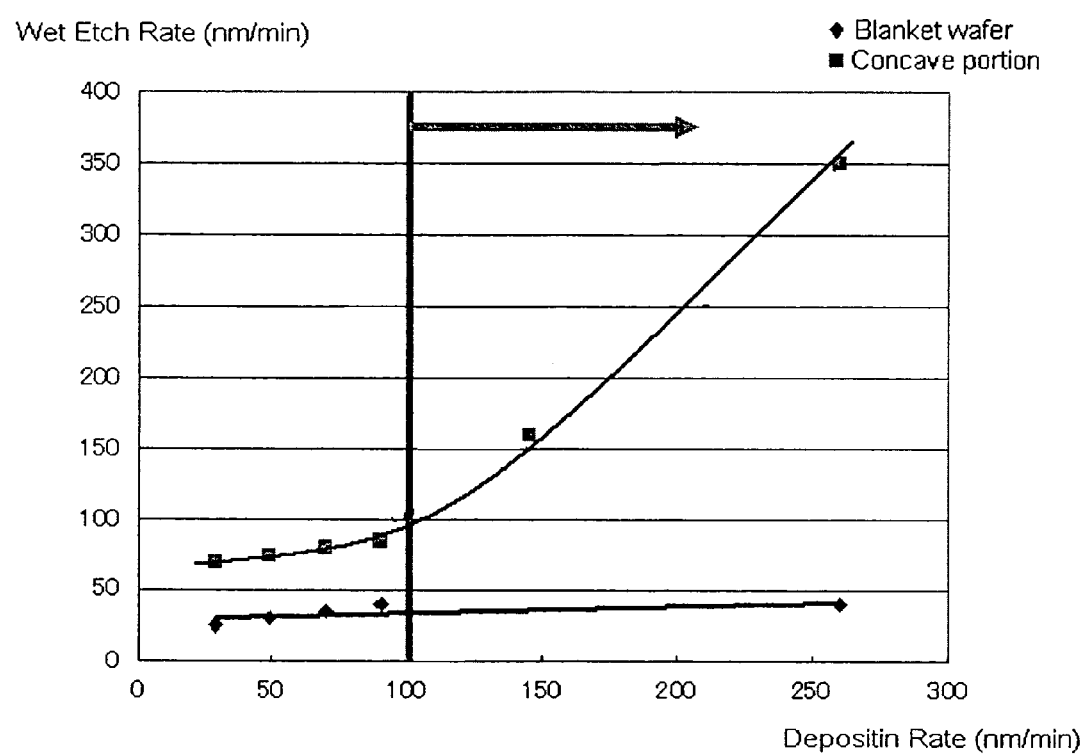
FIG. 4 is a graph showing the relationship between wet-etch rate (nm/min) on the irregular surfaces and deposition rate (nm/min) according to embodiments of the present invention.

FIG. 4 is a graph showing the relationship between wet-etch rate (nm/min) on the irregular surfaces and deposition rate (nm/min). As shown in FIG. 4, when the deposition rate is about 100 nm/min or less, the wet-etch rate on the irregular surfaces is significantly lower than that when the deposition rate is beyond 100 nm/min, whereas the etch rate on the blanket wafers is not significantly changed in relation to the deposition rate. It is understood that by controlling the deposition rate at about 100 nm/min or less, the film density can significantly be increased, and the wet-etch rate particularly on the irregular surfaces can surprisingly be as low as about 100 nm/min or less which is as low as about two times (less than three times) the wet-etch rate on the blanket wafers. When the deposition rate is beyond 100 nm/min, the differences between the wet-etch rate on the blanket wafer and the wet-etch rate on the irregular surfaces become greater.

The film density in Example 4 and that in Comparative Example 2 are 2.15 g/cm$^3$ and 2.12 g/cm$^3$, respectively, which are relatively close. However, the wet-etch rate on the irregular surface in Example 4 is less than ¼ of that in Comparative Example 2. A film density between 2.15 g/cm$^3$ and 2.12 g/cm$^3$ would be critical to film structure associated with wet-etch rate on the irregular surface.

The present invention includes the above mentioned embodiments and other various embodiments including the following:

1) A method for forming low-dielectric-constant film and oxide film on a semiconductor substrate, characterized by forming oxide film exhibiting filling performance by using, as material gas, silicon hydrocarbon compound expressed by the general formula Si$_a$O$_b$H$_c$N$_x$ (in the formula, a, b and c are arbitrary integers, while x is an integer of 0 to 2). This method is also characterized by improved filling performance, achieved by setting the susceptor temperature to a range of −50° C. to 50° C. to form an active liquid precursor for filling holes and spaces between wires.

2) The method according to 1) above, wherein additive gases of acetone, IPA or other CH or CHO groups are used to lower viscosity, in view of the fact that lower viscosity is essential to achieving improved filling performance.

3) The method according to 1) or 2) above, wherein the material molecules have at least one Si—O bond, and in addition material molecules having Si—Si, Si—N— or Si—H bond or any combination thereof are used to increase the film density and thereby lower the wet-etch rate.

4) The method according to any one of 1) to 3) above, wherein the film growth speed is kept to 100 nm/min or below in light of the relationship of pattern filling speed and density—relationship that increasing the growth speed raises the density of blanket film but lowers the density of film formed in an irregular pattern—and as a result a film density exceeding 2.1 g/cm$^3$ can be achieved after heat treatment.

5) The method according to any one of 1) to 4) above, wherein the surface condition of the base layer is changed from hydrophobic to hydrophilic by means of plasma preprocessing to control surface tension and thereby improve wettability, because wettability is affected significantly by the base on which film is formed.

6) The method according to 5) above, wherein the plasma preprocessing uses oxidizing agent, inactive gas, silicon material or any combination thereof.

7) The method according to any one of 1) to 6) above, wherein sometimes liquid precursor may be used in preprocessing where additive gases of IPA, acetone, hexane or other CH or CHO groups are used to cause plasma discharge, in order to form plasma-activated liquid precursor with a small width.

8) The method according to any one of 1) to 7) above, wherein annealing is performed after the film formation process to harden the film. Annealing is implemented as heat annealing or UV curing.

9) The method according to 8) above, wherein the annealing temperature is controlled in a range of 200° C. to 1,100° C. in consideration of base film.

10) The method according to any one of 1) to 9) above, wherein the silicon hydrocarbon used to form filling oxide film contains at least one type of compound expressed by the chemical formula below:

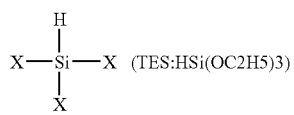 (TES:HSi(OC2H5)3)

(wherein X is either H, OH, $CH_3$, $C_2H_5$, $OCH_3$ or $OC_2H_5$). For example, this compound may be triethoxysilane.

11) The method according to any one of 1) to 9) above, wherein the silicon hydrocarbon used to form filling oxide film contains at least one type of compound expressed by the chemical formula below:

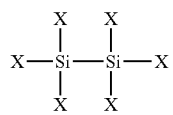

(wherein X is either H, OH, $CH_3$, $C_2H_5$, $OCH_3$ or $OC_2H_5$). For example, this compound may be trimethoxysilane.

12) The method according to any one of 1) to 9) above, wherein the silicon hydrocarbon used to form filling oxide film contains at least one type of compound expressed by the chemical formula below:

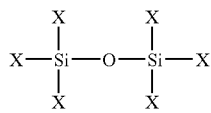

(wherein X is either H, OH, $CH_3$, $C_2H_5$, $OCH_3$ or $OC_2H_5$). For example, this compound may be 1,1,3,3 tetramethyl disiloxane.

13) The method according to any one of 1) to 9) above, wherein the silicon hydrocarbon used to form filling oxide film contains at least one type of compound expressed by the chemical formula below:

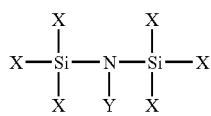

(wherein X is either H, OH, $CH_3$, $C_2H_5$, $OCH_3$ or $OC_2H_5$, while Y is either H, $CH_3$ or $C_2H_5$). For example, this compound may be 1,1,3,3 tetramethyl disilazane.

14) The method according to any one of 1) to 9) above, wherein the silicon hydrocarbon used to form filling oxide film contains at least one type of compound expressed by the chemical formula below:

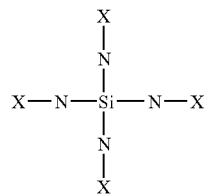

(wherein X is either H, OH, $CH_3$, $C_2H_5$, $OCH_3$ or $OC_2H_5$). For example, this compound may be bis trimethyl silane.

15) The method according to any one of 1) to 14) above, wherein oxide film is formed by using, in addition to silicon hydrocarbon material, any one or combination of oxidizing material, additive gas and inactive gas.

16) The method according to 15) above, wherein the additive gas comprises H2 or CxHyOz (x is an integer of 1 to 10, y is a natural number, and z is 0, 1 or 2) or combination thereof.

17) The method according to 15) or 16) above, wherein the flow rate of additive gas is between 5 sccm and 900 sccm.

18) The method according to any one of 15) to 17) above, wherein the inactive gas comprises He, Ar, Kr or Xe or any combination thereof.

19) The method according to any one of 15) to 18) above, wherein the flow rate of inactive gas is between 10 sccm and 10,000 sccm.

20) The method according to any one of 15) to 19) above, wherein the oxidizing material is O3, O2, CO2, N2O or H2O or any combination thereof.

21) The method according to any one of 15) to 20) above, wherein the flow rate of oxidizing material is between 10 sccm and 3,000 sccm.

22) The method according to any one of 15) to 21) above, wherein nitrogen content is controlled, if controlled at all, using N2, NH3 or N2O or any combination thereof.

23) The method according to 22) above, wherein the flow rate of nitrogen gas is between 10 sccm and 3,000 sccm.

24) The method according to any one of 1) to 23) above, wherein high-frequency power of any frequency selected from the range of 13.56 MHz to 60 MHz is applied.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming an insulation film on a semiconductor substrate by plasma reaction, comprising:
providing a substrate having an irregular surface including concave portions placed on a susceptor in a reaction chamber;
introducing into the reaction chamber a process gas comprising: (i) a source gas of a silicon-containing hydrocarbon compound comprising in its molecule at least one Si—O bond and at least one bond selected from the group consisting of a Si—Si bond, Si—N bond, and Si—H bond; (ii) an additive gas constituted by C, H, and optionally O; (iii) an oxidizing gas; and (iv) an inert gas;

controlling the temperature of the susceptor at −50° C. to 50° C., and flow rates of the respective gases to satisfy the following relationship: (i)<(iii)<(ii)<(iv); and depositing by plasma reaction an insulation film constituted by Si, O, H, and optionally N on the irregular surface of the substrate including the concave portions at a deposition rate of 100 nm/mm or less.

2. The method according to claim 1, further comprising heat-treating the substrate with the insulation film, thereby increasing a density of the insulation film to more than 2.12 g/cm³ as a result of the heat treatment.

3. The method according to claim 2, wherein the heat-treating step is performed by thermal annealing or UV curing.

4. The method according to claim 3, wherein the annealing step is performed at a temperature of 200° C. to 1,100° C.

5. The method according to claim 1, further comprising, as a preliminary treatment, introducing an auxiliary gas selected from the group consisting of oxidizing gas, inert gas, and a gas constituted by C, H, and optionally O into the reaction chamber for plasma treatment of the substrate before introducing the reaction gas.

6. The method according to claim 5, wherein the auxiliary gas is He or $H_2$.

7. The method according to claim 5, wherein the auxiliary gas is isopropyl alcohol, acetone, or hexane.

8. The method according to claim 1, wherein a flow rate of the source gas is no more than 2.8% of the total flow rate of the process gas.

9. The method according to claim 1, wherein the additive gas is isopropyl alcohol or acetone.

10. The method according to claim 1, wherein the irregular surface has a three-dimensional structure of aluminum, tungsten, or tungsten silicon.

11. The method according to claim 1, wherein the insulation film has a thickness of 25 nm to 70 nm.

12. The method according to claim 1, wherein the irregular surface with the concave portion is a patterned surface for wiring.

13. The method according to claim 1, wherein the concave portion of the irregular surface of the substrate has an aspect ratio of about 1/3 to about 1/10.

14. The method according to claim 1, wherein the concave portion of the irregular surface has holes or grooves, and the deposition step is performed on the irregular surface to fill the holes or grooves with the insulation film.

15. The method according to claim 1, wherein the insulation film is a silicon oxide film.

16. The method according to claim 15, wherein at least one X is neither H nor OH in each formula.

17. The method according to claim 1, wherein said silicon-containing hydrocarbon compound is at least one compound selected from the group consisting of:

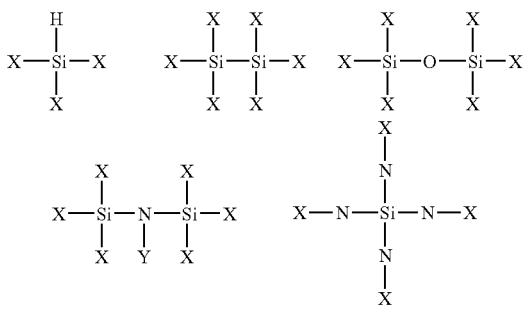

wherein each X is independently H, OH, $CH_3$, $C_2H_5$, $OCH_3$, or $OC_2H_5$, and Y is H, $CH_3$, or $C_2H_5$.

18. A method for forming an interconnect structure, comprising the steps of:

forming a three-dimensional structure for interconnect in a substrate; and forming an insulation layer on a surface of the three-dimensional structure using the method of claim 1.

19. The method according to claim 18, further comprising wet-etching the insulation film.

20. The method according to claim 18, wherein the step of forming a three-dimensional structure comprises forming a layer of aluminum, tungsten, or tungsten silicon as a wiring layer and etching the layer in a pattern.

21. The method according to claim 1, wherein ratios of the flow rates of the respective gases are controlled to satisfy the following relationship: (i)/(iv)/(iii)/(ii)=(10)/(100-10000)/(15-100)/(20-300).

22. The method according to claim 1, wherein the ratios of the flow rates of the respective gases are controlled to satisfy the following relationship: (i)/(iv)/(iii)/(ii)=(10)/(500-2000)/(20-80)/(40-200).

* * * * *

UNITED STATES PATENT AND TRADEMARK OFFICE
CERTIFICATE OF CORRECTION

PATENT NO. : 7,718,553 B2
APPLICATION NO. : 11/525147
DATED : May 18, 2010
INVENTOR(S) : Atsuki Fukazawa and Nobuo Matsuki It is certified that error appears in the above-identified patent and that said Letters Patent is hereby corrected as shown below:

At column 12, line 45, change "0° C." to --10° C.-- therefor.

At column 17, line 7, in Claim 1, change "nm/mm" to --nm/min-- therefor.

Signed and Sealed this

Fifth Day of October, 2010

David J. Kappos
*Director of the United States Patent and Trademark Office*